United States Patent [19]
Kubota

[11] Patent Number: 5,858,162
[45] Date of Patent: Jan. 12, 1999

[54] PLASMA PROCESSING APPARATUS

[75] Inventor: Shinji Kubota, Kanagawa, Japan

[73] Assignee: Sony Corporation, Tokyo, Japan

[21] Appl. No.: 877,979

[22] Filed: Jun. 18, 1997

Related U.S. Application Data

[63] Continuation of Ser. No. 480,955, Jun. 7, 1995, abandoned, and Ser. No. 188,842, Jan. 31, 1994, abandoned.

[30] Foreign Application Priority Data

Jan. 29, 1993 [JP] Japan .................................... 5-013830

[51] Int. Cl.$^6$ .................................................. H05H 13/00
[52] U.S. Cl. .................................... 156/345; 118/723 MP; 118/723 MR; 118/723 MA
[58] Field of Search ..................... 156/345; 118/723 MR, 118/723 MA, 723 MP; 204/298.37, 298.38, 298.16

[56] References Cited

U.S. PATENT DOCUMENTS

| | | | |
|---|---|---|---|
| 4,808,258 | 2/1989 | Otsubo et al. ....................... | 156/345 X |
| 4,960,071 | 10/1990 | Akahori et al. .............. | 118/723 MP X |
| 4,999,320 | 3/1991 | Douglas .............................. | 156/345 X |
| 5,087,857 | 2/1992 | Ahn ..................................... | 315/111.21 |
| 5,221,403 | 6/1993 | Nozawa et al. ......................... | 156/345 |
| 5,279,669 | 1/1994 | Lee ................................... | 118/723 MR |
| 5,292,370 | 3/1994 | Tsai et al. ......................... | 118/723 MP |

*Primary Examiner*—Thi Dang
*Attorney, Agent, or Firm*—Hill & Simpson

[57] ABSTRACT

A plasma processing apparatus including a chamber, a device for exhausting the chamber, an electrode, which is provided within the chamber, for mounting a workpiece to be processed, a device for generating a bias electric field near a wall surface of the chamber, a device for generating a magnetic field substantially parallel to the chamber wall to thereby generate a magnetron discharge by the interaction between the bias electric field and the magnetic field, and a device for providing a high frequency into the chamber.

11 Claims, 7 Drawing Sheets

PLASMA PROCESSING APPARATUS

This is a continuation of application Ser. No. 08/480,955, filed Jun. 7, 1995, now abandoned, which is a continuation, of application Ser. No. 08/188,842, filed Jan. 31, 1994, now abandoned.

BACKGROUND OF THE INVENTION

1. Field of the Invention

The present invention relates to a plasma processing apparatus for use with a plasma etching apparatus, a plasma CVD (chemical vapor deposition) apparatus, a plasma ashing apparatus or the like used in various semiconductor manufacturing processes, for example.

2. Description of the Prior Art

As shown in a cross-sectional view forming FIG. 1A, for example, when semiconductor integrated circuit devices are manufactured, it is customary that a contact-hole 4 is formed through an interlevel insulator layer 3 in order to electrically contact an electrode or upper layer interconnection (hereinafter simply referred to as an upper layer interconnection) to a semiconductor region formed on a semiconductor substrate 1 or lower layer interconnection 2 formed on the semiconductor substrate 1.

In this case, in order to form the upper layer interconnection into the contact-hole 4 with a satisfactory coverage without cavities or the like that causes a contact resistance, as shown in FIG. 1B, it is not preferable that the contact-hole 4 is shaped as a barrel which is narrow in the inside in cross-section.

Therefore, in order to form the above-mentioned contact-hole 4, an etching process with excellent anisotropy must be carried out through an opening 5a of an etching mask 5 that is formed on the interlevel insulator layer 3 by a photoresist.

As a method of carrying out the anisotropy etching, there is known a reactive ion etching (hereinafter simply referred to as an RIE) in which charged particles (ions) are generated and an anisotropy direction is determined by the application of a bias voltage.

A parallel plate system RIE which carries out the RIE is carried out under a relatively high process pressure ranging from 10 to 100 Pa, i.e., under low vacuum degree. As a consequence, ions are considerably scattered when the process pressure collides with a gas seed of residual gas with the result that anisotropy in the etching process is checked by the scattering of ions as schematically shown in FIG. 1A.

In order to improve direction, i.e., anisotropy of ions, the process pressure must be lowered (high vacuum degree) or ions must be accelerated in the direction perpendicular to the surface of the substance with a larger energy, e.g., about 500 eV.

However, to increase an etching rate to some extent, a high density plasma is required, which imposes a restriction upon reducing a process pressure. Therefore, when ions are accelerated with a large energy, there is then the problem that ion radiation surface is damaged.

On the other hand, as shown in FIG. 2, in a magnetron RIE which carries out a high frequency discharge in a magnetic field, a plasma 9 is formed by a high frequency discharge, and an etched material 11 which should be etched is disposed on a cathode 10 to which a high frequency electric power from a high frequency power supply 7 is applied. When an ion 8 accelerated by an electric field of an ion sheath region 14 formed on the etched material 11 collides with the etched material 11, the ion seed loses an energy and discharges a secondary electron. This secondary electron has a negative charge and is therefore accelerated in the opposite direction to that of ion. The secondary electron is affected by a magnetic field and moved in a drift fashion of electric field E×magnetic flux density B so that, as schematically shown by an arrow a in FIG. 2, this secondary electron moves in a cycloidal fashion to scan the whole surface of the etched material 11. Thus, there is increased the probability that the electron and the gas seed collide with each other, thereby a higher-density plasma being generated at a lower pressure.

However, in this case, since the cathode area is finite, the drift of electron is ended at the end face of an electrode ID whose electric field is small wherein electrons are collected to generate a high density plasma portion 14, thereby making plasma irregular.

Irregularity of plasma deteriorates etching characteristics such as s problem of charge-up and irregular etching. Also, a voltage on the ion sheath region is indirectly determined by density, pressure, electric power or the like of the process and cannot be controlled directly. There is then the problem that the etching cannot be controlled accurately without difficulty.

Further, as another conventional plasma etching apparatus, there is known an etching apparatus based on an electron cyclotron resonance (hereinafter simply referred to as an ECR) system shown in FIG. 3.

In this ECR etching apparatus, an etched material 11 is disposed on a cathode 18 to which an electric power of low frequency of 100 kHz is supplied from a low frequency power supply 17.

Owing to an interaction between a magnetic field (875 G (Gauss) generated by a magnetic coil 15 and a microwave (2.45 GHz) supplied from a waveguide (not shown), as shown in FIG. 4, there is formed an ECR area 16 in which an electron e circles so as to wound around a magnetic field (magnetic flux B) generated by the magnetic coil 15. More specifically, the ECR is generated by making one cycle of this electron e and one cycle of the microwave coincident with each other. As a consequence, the microwave is absorbed by the plasma efficiently and there is increased the probability that an electrolytic dissociation occurs due to electron impulse.

Ions thus generated are pulled onto the etched material 11 on the cathode 18.

The proposed conventional ECR etching apparatus is disclosed in J. Vac. Sci. Technol. B3 (4) P1025 (1985) by Keizo Suzuki et al. This ECR etching apparatus achieved a low gas pressure (0.04~0.4 Pa) and a high plasma density $(1 \times 10^{11} \sim 1 \times 10^{12}$ electrons/cm$^3$).

In this ECR etching apparatus, however, the ECR thereof is produced with a microwave of 2.45 GHz and in a magnetic field of 875 G. Therefore, this ECR etching apparatus needs a magnet which generates a high magnetic flux density, which unavoidably makes the apparatus large in size and expensive.

Further, in this conventional ECR etching apparatus, electrons collide with the wall surface and are lost so that a plasma density near the wall surface and a plasma density at the central portion of the ECR area 16 become different from each other. There is then the problem that the plasma becomes irregular.

Furthermore, in this ECR etching apparatus, as shown in FIG. 3 by arrows B which show the state that magnetic fluxes are generated, magnetic fields are curved near the portion in which the etched material 11 is disposed, thereby the shape processed by the etching process being deteriorated and also uniformity of the etching being deteriorated.

Japanese laid-open patent publication No. 3-68773 (corresponding to U.S. Pat. No. 4,990,229) describes a plasma processing apparatus of a helicon system. As shown in the above-mentioned related art, this plasma processing apparatus can generate a plasma at a low pressure ($10^{-2} \sim 10^{-1}$ Pa) with high density ($10^{12}$ to $10^{13}$ electrons/$cm^2$). This plasma makes effective use of Landau damping in which energy can be transmitted to electrons efficiently when a phase velocity $V_0$ of drift wave in the plasma and a frequency that excites a plasma become coincident with each other.

The phase velocity of this drift wave is expressed as:

$$V_D = -\frac{kTe}{eB} \cdot \frac{1}{ne} \cdot \frac{dn}{dx} \tag{1}$$

where k is the Boltzmann's constant, ne is the plasma density, Te is the electron temperature, B is the magnetic flux density and dn/dx is the plasma density gradient.

Conditions with which this high density plasma is generated are dependent on parameters which are difficult to be controlled, such as the plasma density, the electron temperature or the like, and are very difficult to be controlled. The plasma processing apparatus of this system also encounters with the problem that the plasma density does not become completely uniform in the diametrical direction.

OBJECTS AND SUMMARY OF THE INVENTION

It is therefore an object of the present invention to provide an improved plasma processing apparatus in which the aforesaid shortcomings of the prior art can be eliminated.

It is an object of the present invention to provide a plasma processing apparatus such as a plasma etching apparatus, a plasma CVD apparatus, a plasma ashing apparatus or the like in which a controllability can be improved.

It is another object of the present invention to provide a plasma processing apparatus in which a shape of product processed by the plasma process can be improved.

It is a further object of the present invention to provide a plasma processing apparatus in which a uniform plasma can be generated.

According to an aspect of the present invention, there is provided plasma processing apparatus which comprises a chamber, a device for exhausting the chamber, an electrode, which is provided within the chamber, for mounting a workpiece to be processed, a device for generating a bias electric field near a wall surface of the chamber, a device for generating a magnetic field substantially parallel to the chamber wall to thereby generate a magnetron discharge by the interaction between the bias electric field and the magnetic field, and a device for providing a high frequency into the chamber.

According to another aspect of the present invention, there is provided a plasma processing apparatus which comprises a chamber, a magnetron discharge generator which generates a plasma so as to confine electrons on cycloidal trajectories near a wall surface of the chamber, and a device for providing a high frequency into the chamber so as to resonate with the electrons.

The above and other objects, features, and advantages of the present invention will become apparent from the following detailed description of an illustrative embodiment thereof to be read in conjunction with the accompanying drawings, in which like reference numerals are used to identify the same or similar parts in the several views.

DETAILED DESCRIPTION OF THE PREFERRED EMBODIMENTS

The present invention will hereinafter be described more in detail with reference to FIG. 5.

Figure 1A:
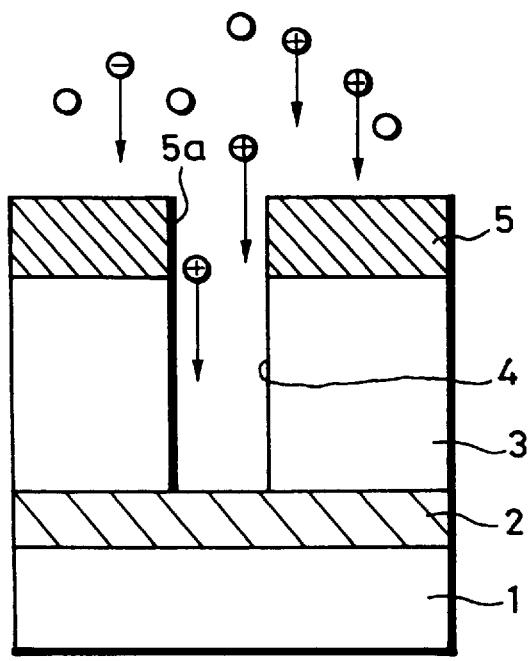
FIGS. 1A and 1B are diagrams used to explain a plasma etching.
Figure 1B:
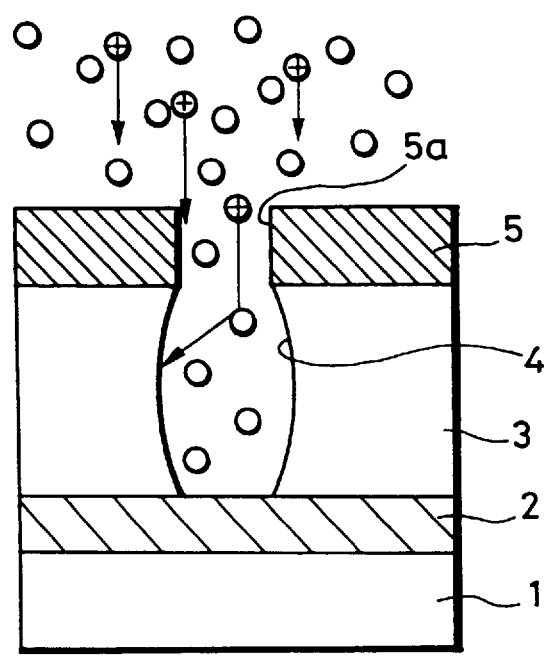
Figure 2:
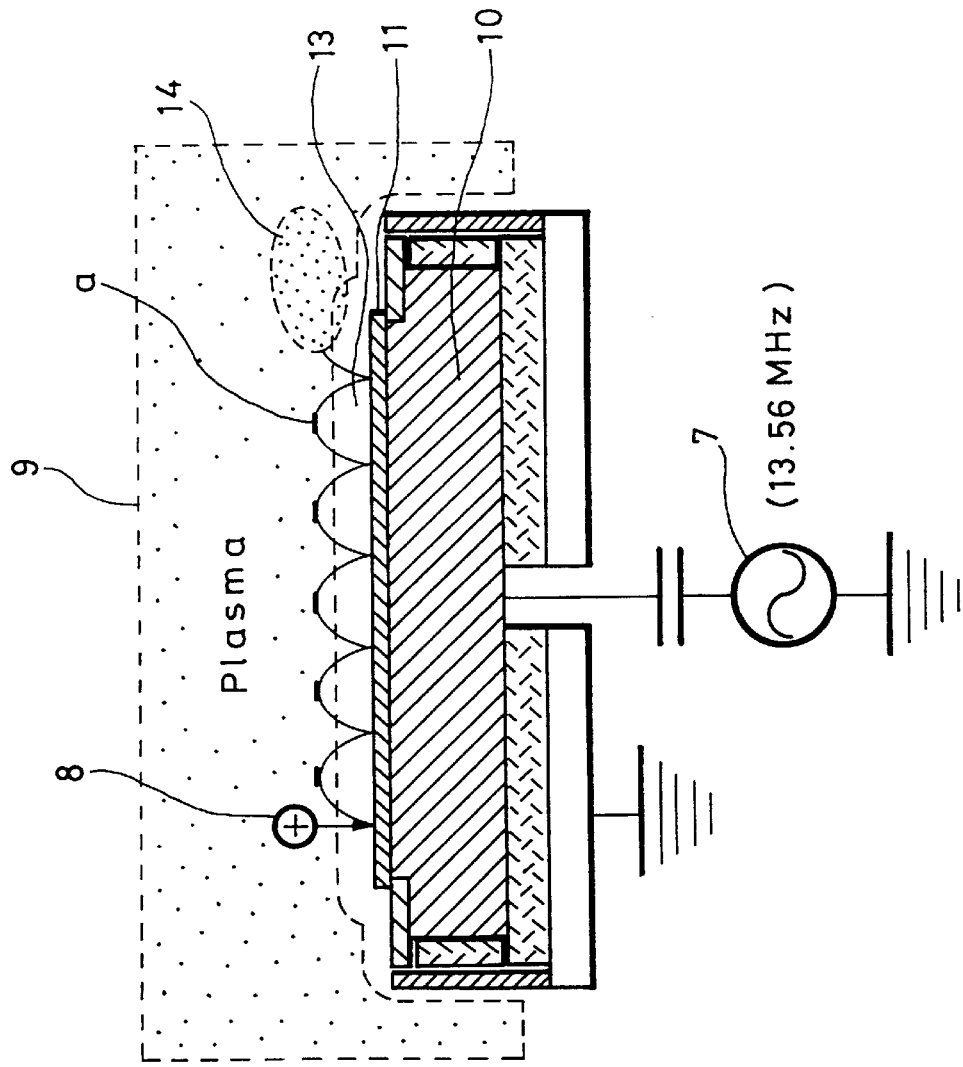
FIG. 2 is a schematic diagram showing an arrangement of a conventional plasma processing apparatus.
Figure 3:
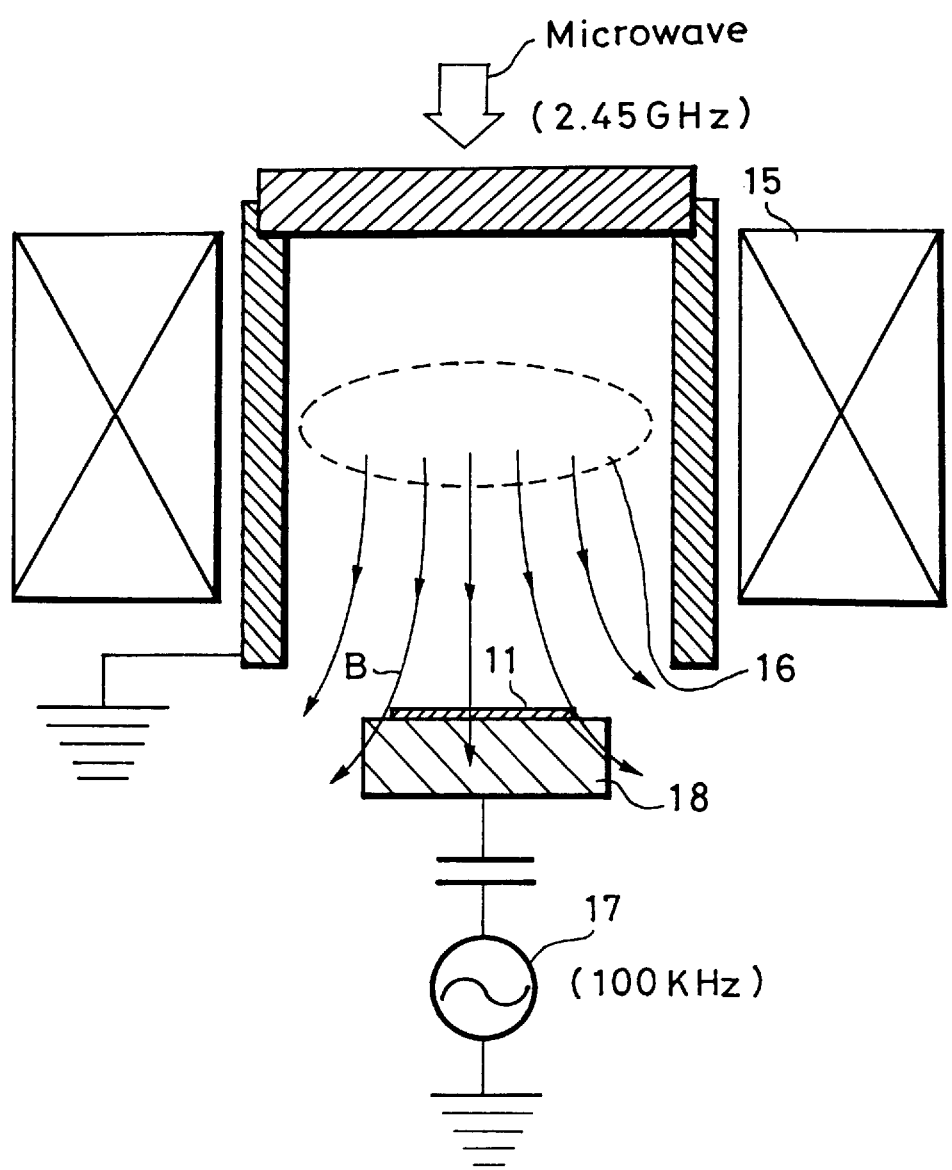
FIG. 3 is a schematic diagram showing an arrangement of a conventional ECR apparatus.
Figure 4:
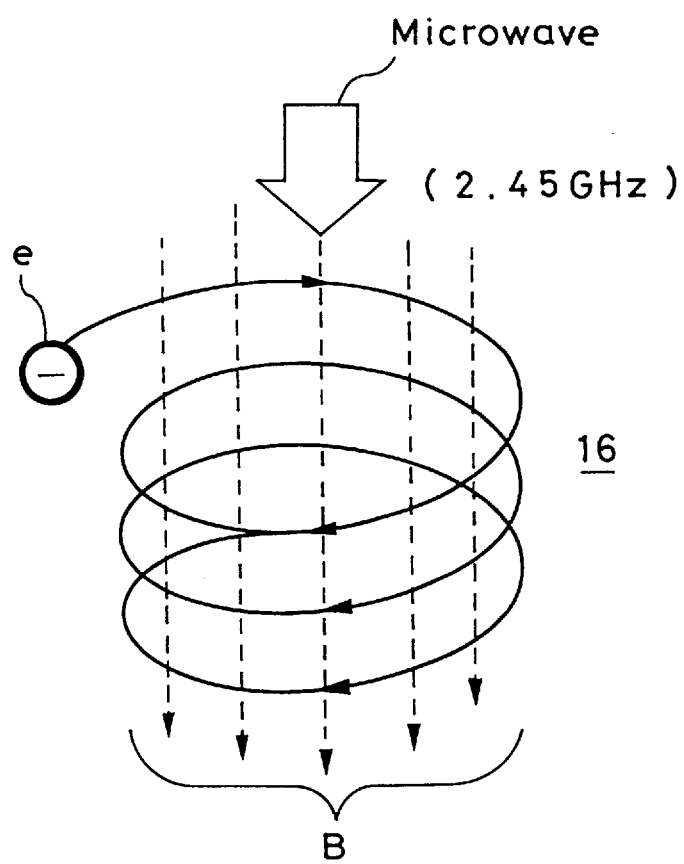
FIG. 4 is a diagram used to explain an ECR principle.
Figure 5:
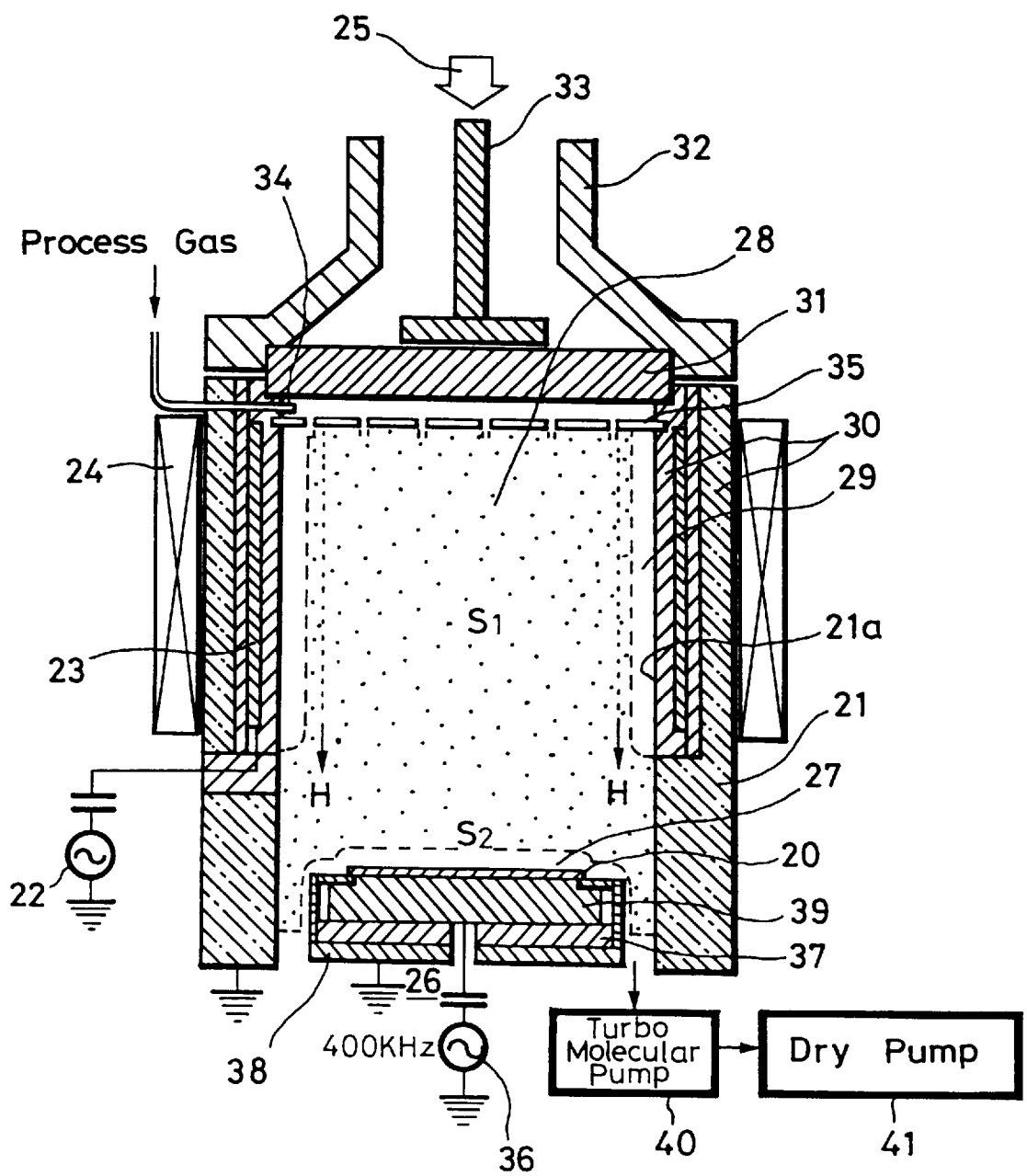
FIG. 5 is a schematic cross-sectional view showing a plasma processing apparatus according to an embodiment of the present invention.

As shown in FIG. 5, there is provided a cylindrical-shaped chamber 21 for a plasma processing apparatus that can be held at a predetermined vacuum degree. In this chamber 21, there are formed a high density plasma generating portion $S_1$ and a plasma processing portion $S_2$ having portion in which a plasma processed material 20 is disposed and in which a plasma processing is carried out by the application of a bias voltage.

In the high density plasma generating portion $S_1$, there are provided a bias electric field generating means 23 including a high frequency or low frequency power supply 22 for generating a bias electric field, a magnetic field applying means 24 for applying a magnetic field H substantially parallel to a wall surface 21a, and a microwave or high frequency applying means 25 for generating a high density plasma near the wall surface 21a of the vessel 21.

The chamber 21 is made of Al, for example, and the bias electric field generating means 23 is provided in the high density plasma generating portion $S_1$. The bias electric field generating means 23 includes a cylindrical-shaped magnetron electrode to be coaxial with the chamber 21 in an inner periphery of the portion A of the chamber 21 and which is sandwiched by an insulator 30 which is difficult to be sputtered and which has a high secondary electron discharge coefficient, such as quartz or the like. This cylindrical-shaped magnetron electrode is applied with an electric power, e.g., 13.56 MHz or 400 kHz from the low frequency or high frequency power supply 22.

The magnetic field applying means 24 can be constructed by an electromagnet formed of a coil that is disposed so as wound around the outer periphery of the chamber 21, for example.

A microwave (e.g., electromagnetic wave of 1 GHz or higher in the description which follows) or high frequency wave (e.g., electromagnetic wave ranging from 10 MHz to 1 GHz in the description which follows) is introduced into the high density plasma generation portion $S_1$ within the chamber 21 by the microwave or high frequency applying means 25. A window 31 made of a quartz is formed on the upper end of the high density plasma generation portion $S_1$ of the chamber 21. Through this window 31, the microwave or high frequency wave is introduced into the chamber 21 from a waveguide 32. In FIG. 5, reference numeral 33 designates a central conductor.

A process gas supply inlet 34 for supplying a process gas is provided in the chamber 21 at its portion where the high density plasma generation portion $S_1$ is constructed.

A gas dispersion plate 35 formed of a quartz plate or the like having a number of apertures bored therethrough to disperse a process gas is disposed between the process gas supplying inlet 34 and the high density plasma generation portion $S_1$.

A high frequency or low frequency applying means 26 that applies a bias voltage is disposed within the chamber 21 at its portion in which the plasma processed material 20 that is processed by the plasma is disposed.

The high frequency or low frequency applying means 26 includes a cathode 39 disposed on a holder of the plasma processed material 20. The cathode 39 is shielded by a conductor 38 disposed in the outside of an insulator 37 made of a ceramic or the like through the insulator 37. A high frequency or low frequency from a low frequency or high frequency power supply 36 is supplied to this cathode 39.

The chamber 21 is evacuated by a turbo-molecular pump 40 and a dry pump 41 and held at a predetermined vacuum degree.

The following table 1 indicates examples of numerical data obtained when the plasma etching is carried out by the plasma processing apparatus according to the present invention. In this case, a polycrystalline Si is formed on an $SiO_2$ surfacing layer as the etched material, i.e., the plasma processed material 20 and the etching is carried out on this polycrystalline Si.

TABLE 1

| Items | Examples of numerical data |
|---|---|
| power supply 22 | 13.56 MHz |
|  | 400~600 W |
| microwave or high frequency | 300 MHz |
| applying means 25 | 800 to 1200 W |
| magnetic field | magnetic flux density |
| applying means 24 | $B = 10^{-2}$ [T] |
| process pressure | $10^{-2}$~$5 \times 10^{-1}$ [Pa] |
| process gas and its | Clz . . . 10~50 [sccm] |
| quantity of flow | HBr . . . 10~50 [sccm] |
| power supply 36 | 400 kHz |
|  | 0~100 [W] |
| plasma density | $10^{12}$~$10^{13}$ [electrons/cm$^2$] |
| etching characteristics | polycrystalline Si . . . |
|  | 300 [nm/min.] |
|  | uniformity . . . ±5 [%] |
|  | surfacing SiO$_2$ selecting |
|  | ratio . . . 20~100 |
|  | etching shape . . . |
|  | vertical |

Figure 6:
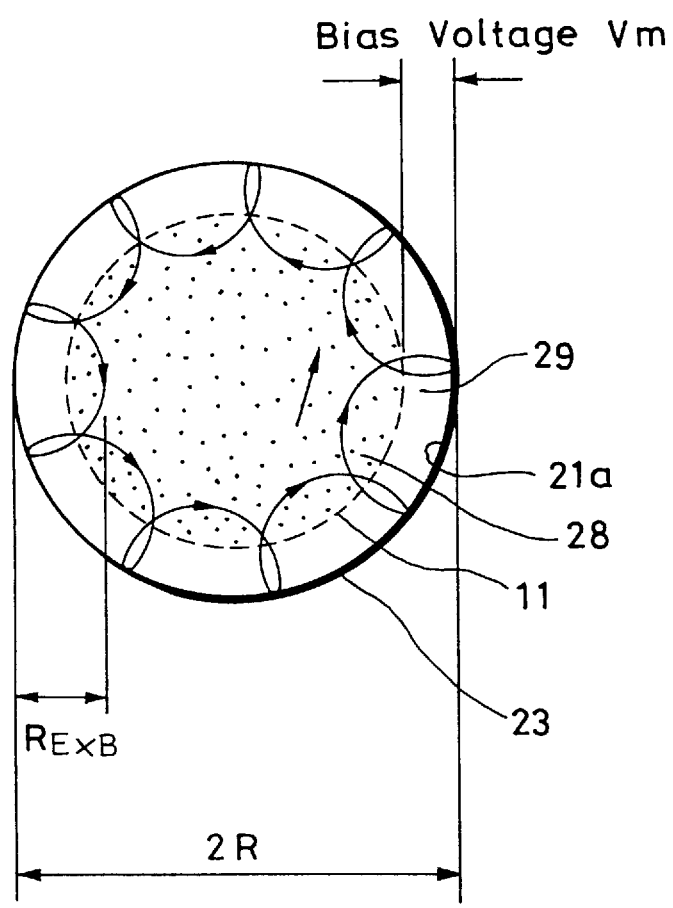
FIG. 6 is a diagram used to explain a magnetron resonance.

With the above-mentioned arrangement, a plasma 28 is generated with a magnetron discharge caused due to an interaction between a magnetic field H generated by the electromagnet of the magnetic field applying means 24 and the bias electric field generating means 23 energized by the supply of an electric power from the power supply 22, i.e., electric field generated by the magnetron electrode. Then, the magnetron discharge is maintained in the ion sheath region 29 generated in the outer periphery of the plasma 28 so that, as shown in FIG. 6, electrons are moved in a cycloidal fashion. Electrons that are moved in a cycloidal fashion are rotated along the wall surface 21a permanently.

At that time, the high frequency or microwave which is synchronized with the rotation of electron is introduced into the chamber 21 from the microwave waveguide 32 through the window 31.

On the other hand, a process gas ($Cl_2$, HBr or the like) is introduced from the process gas supplying inlet 34 into the plasma generation portion $S_1$ provided within the chamber 21.

The above-mentioned process gas is uniformly introduced into the plasma generation portion $S_1$ by the gas dispersion plate 35.

An acceleration energy of ions applied to the plasma processed material 20 is controlled by applying the high or low frequency to the cathode 39 from the power supply 36. Then, ions are accelerated in the ion sheath region 27 and the etching is carried out on the plasma processed material 20.

A uniform density of the plasma 28 can be controlled by an intensity of magnetic field generated by the magnetic field applying means 24 and by an electric power from the low or high frequency power supply 22.

On the other hand, conditions of plasma resonance to maximize the plasma density can be controlled with the high frequency or microwave introduced from the magnetic field applying means 24, the power supply 22 and the microwave waveguide 32.

More specifically, the specific features of the plasma processing apparatus according to the present invention lie in that a plasma density distribution can be controlled directly and that a high density plasma can be achieved by controlling the electric power of the low or high frequency power supply 22.

Figure 7:
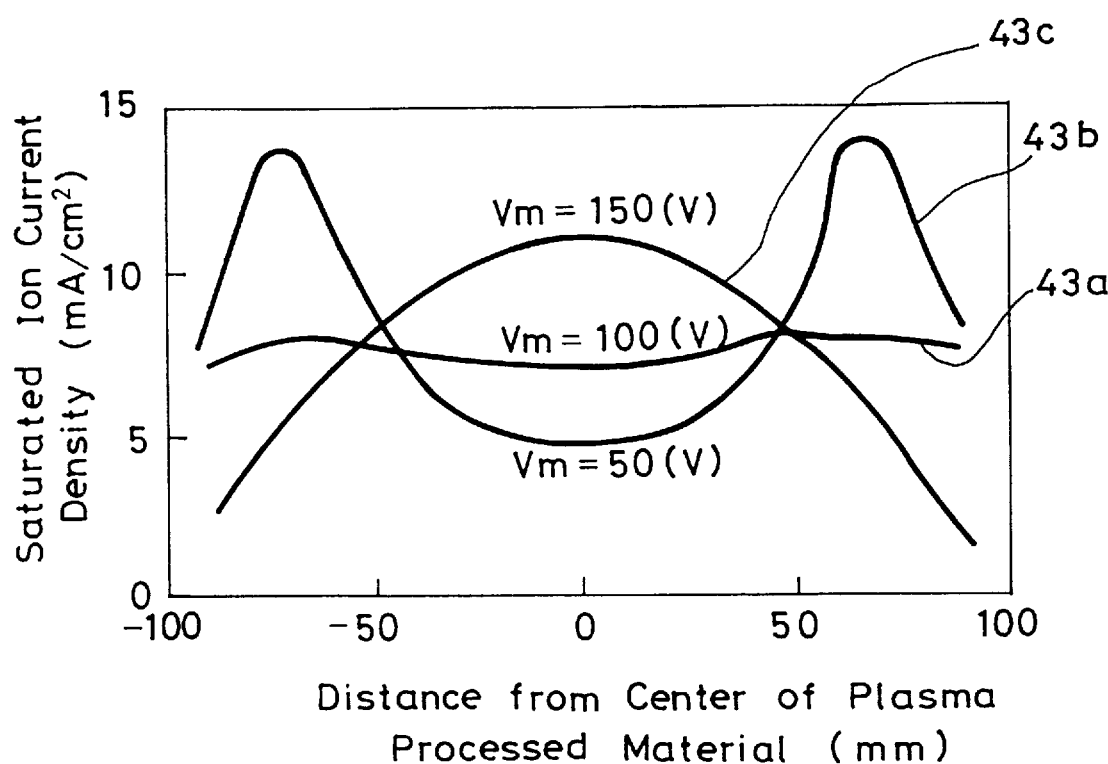
FIG. 7 is a graph showing a position dependence of a saturated ion current density, and to which reference will be made in explaining how to make a plasma uniform with an excellent controllability.

FIG. 7 is a graph showing a distribution (corresponding to a plasma density distribution) in which a saturated ion current density is distributed on the plane of the plasma processed material 20, i.e., a distribution measured when a bias voltage Vm of a magnetron electrode (bias electric field generating means 23) determined by an electric power of the low or high frequency power supply 22 is varied. By controlling the bias voltage Vm, a uniform plasma is achieved as shown by a curve 43a obtained when Vm=100V, for example. Curves 43b and 43c show measured results of distributions obtained when Vm=50V and Vm=150V, respectively.

The plasma processing apparatus according to the present invention can generate a high density plasma based on the magnetron discharge principle and the resonance of a microwave. The principle of the resonance will be described hereinafter.

In the bias electric field generating means 23 shown in FIG. 6, i.e., in the cylindrical magnetron electrode, if the parallel magnetic field H (magnetic flux density B) is applied to this magnetron electrode and the high frequency is further applied to this cylindrical electrode, then a magnetron discharge occurs. In this magnetron discharge, electrons accelerated in the ion sheath region to which the bias voltage Vm is applied are rotated due to the interaction occurred between the magnetic field and the high frequency and moved in a cycloidal fashion (E×B drift motion) shown in FIG. 7.

A velocity of electron that moves in an E×B drift fashion is expressed by the following equation (2):

$$V_{EXB} = E/B \qquad (2)$$

where E is the electric field and B is the magnetic field density.

A time T needed when the electron travels around the circumference having a diameter 2 R is expressed by the following equation (3):

$$T = \frac{2\pi R}{V_{EXB}} = 2\pi R \cdot \frac{B}{E} \quad (3)$$

A resonance occurs when a period required by the electron to travel around the circumference and a period of the microwave or high frequency coincide with each other.

Assuming that $f_r$ represents a frequency of a microwave, then the frequency $f_r$ is expressed by the following equation (4):

$$f_r = \frac{1}{T} = \frac{1}{2\pi R} \cdot \frac{E}{B} \quad (4)$$

Assuming that $E=10^6$ [V/m]. $B=100$ [G]=$10^{-2}$ [T] and $R=0.15$ [m], then the above-mentioned equation (4) yields $f_r=3.3\times10^6$ [Hz]=330 [MHz].

In this case, a frequency at which the resonance occurs lies in the high frequency region. Owing to this resonance, the microwave or microwave or high frequency electric power generated by the high frequency generating means 25 is absorbed by the plasma efficiently.

Owing to this resonance, a high plasma density ($10^{12}$~$10^{13}$/cm$^{-3}$) was achieved in the low pressure ($10^2\times 10^{-1}$ Pa) region.

On the other hand, a Larmor radius $R_{EXB}$ required when the electron is moved in a cycloidal fashion is expressed by the following equation (5):

$$R_{EXB} = 3.37\times 10^{-6} \sqrt{V} \, m^{1/2}/B \quad (5)$$

Assuming that $Vm=100$ [V] and that $B=100$ [G]=$10^{-2}$ [T], then $R_{EXB}=3.37\times 10^{-3}$ [m]. More specifically, by controlling the bias voltage Vm, a trajectory of electron movement can be controlled with the result that a plasma density distribution can be controlled.

While the plasma processing apparatus according to the present invention is applied to the etching processing as described above, the present invention is not limited thereto and can be applied to a variety of plasma processing apparatus, such as a plasma CVD apparatus, a plasma ashing apparatus or the like.

According to the present invention, the high density plasma of $10^{12}$~$10^{13}$ electrons/cm$^2$ can be generated at low pressure (low process pressure) of about $10^{-2}$~$10^{-1}$ Pa. Further, since the electrons are permanently rotated while being moved in a cycloidal fashion as described above with reference to FIG. 7, electrons can be prevented from being collected so that a uniform plasma can be generated. Therefore, a uniform plasma processing can be carried out by such uniform plasma.

Moreover, according to the present invention, the plasma energy can be controlled by controlling the microwave or high frequency electric power by the microwave or high frequency applying means 25 and also by controlling the low frequency of the bias electric field generating means 23 or the electric power of the high frequency power supply 22. Also, the bias voltage of the plasma processed material 20 can be independently controlled by the electric power of the low or high frequency power supply 36. Therefore, the plasma processing with excellent controllability can be carried out.

Further, since the magnetic field applied to generate a plasma is about 100 G, for example, the influence exerted upon the portion in which the plasma processed material 20 is disposed can be reduced, thereby avoiding the plasma processing from becoming irregular due to the curved magnetic field.

Furthermore, the plasma can be generated with a small electric power and with a small magnetic field, thereby avoiding the plasma processing apparatus from becoming large in size.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A plasma processing apparatus comprising:
    a chamber;
    means for exhausting said chamber;
    a workpiece holder provided within said chamber for mounting a workpiece to be processed, said workpiece holder comprising an insulator member, an electrode disposed adjacent the insulator member and a shielding conductor surrounding the insulator member and a portion of the electrode and connected to ground;
    means for connecting the electrode to a high or low frequency power supply;
    means for generating a bias electric field near a wall surface of said chamber;
    means for generating a magnetic field substantially parallel to a chamber wall to thereby generate a magnetron discharge by the interaction between the bias electric field and the magnetic field;
    means for providing a high frequency or microwave energy into said chamber, the high frequency or microwave energy having a frequency which synchronizes a cyclotron motino of electrons traveling around an inner periphery of the chamber to form a uniform plasma; and
    control means for independently controlling the bias electric field generating means, the magnetic field generating means, the high frequency or microwave energy providing means and the electrode power supply, whereby plasma density distribution may be controlled by controlling the bias electric field, the plasma energy may be controlled by the applied microwave energy, and ion acceleration energy of plasma generated in the apparatus is controlled by the frequency of the power applied to the electrode.

2. A plasma processing apparatus according to claim 1, wherein said bias electric field generating means includes a magnetron electrode and a high frequency power supply.

3. A plasma processing apparatus according to claim 1, wherein said bias electric field generating means includes a magnetron electrode and a low frequency power supply.

4. A plasma processing apparatus according to claim 1, wherein said magnetic field generating means is an electromagnet disposed in an outer periphery of said chamber.

5. A plasma processing apparatus according to claim 1, wherein said high frequency providing means is a microwave applying means.

6. A plasma processing apparatus according to claim 1, wherein said high frequency providing means is a high frequency applying means for applying a high frequency ranging from 10 MHz to 1 GHz.

7. A plasma processing apparatus according to claim 1, wherein said electrode is a cathode.

8. A plasma processing apparatus according to claim 1, wherein said chamber has a cylindrical shape.

9. A plasma processing apparatus according to claim 1, further comprising a susceptor, which is electrically isolated, for supporting said electrode.

10. A plasma processing apparatus according to claim 1, wherein said magnetron discharge maintains a cyclotron motion of electron and a cycle of said cycloidal motion and a cycle of said high frequency are made coincident with each other.

11. A plasma processing apparatus according to claim 1, wherein resonance occurs when a cycle in which an electron travels around an inner periphery of said chamber and a cycle of said high frequency energy becomes coincident with each other.

* * * * *